US009334566B2

(12) United States Patent
Chandrasekharan et al.

(10) Patent No.: US 9,334,566 B2
(45) Date of Patent: May 10, 2016

(54) MULTI-TRAY BALLAST VAPOR DRAW SYSTEMS

(71) Applicant: Lam Research Corporation, Fremont, CA (US)

(72) Inventors: Ramesh Chandrasekharan, Portland, OR (US); Davis Weymann, Corvallis, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 185 days.

(21) Appl. No.: 14/089,009

(22) Filed: Nov. 25, 2013

(65) Prior Publication Data

US 2015/0145154 A1 May 28, 2015

(51) Int. Cl.

*B01F 3/04* (2006.01)
*C23C 16/448* (2006.01)
*C23C 16/455* (2006.01)

(52) U.S. Cl.

CPC ....... *C23C 16/4481* (2013.01); *C23C 16/45561* (2013.01)

(58) Field of Classification Search

CPC ............ B01F 3/04468; C23C 16/4481; C23C 16/45561
USPC ............... 261/28, 30, 37, 64.1, 66, 72.1, 108, 261/109, 119.1, 125, DIG. 65
See application file for complete search history.

(56) References Cited

U.S. PATENT DOCUMENTS 24,200 A * 5/1859 Covel ........................ F02M 1/00 261/125
55,950 A * 6/1866 Brown .................. B01F 3/0446 261/119.1
245,443 A * 8/1881 Callahan ................. B01D 3/20 261/114.1
366,168 A * 7/1887 Huber ...................... F02M 1/00 261/125
409,570 A * 8/1889 Elder ....................... F02M 1/00 261/125
550,317 A * 11/1895 Callahan ................... F24F 6/04 261/119.1
1,301,610 A * 4/1919 Scott ........................ B01J 19/32 159/31
1,545,755 A * 7/1925 Graham ..................... C10J 1/14 261/119.1
1,583,255 A * 5/1926 Moore ................ F24D 19/0082 126/590
1,985,689 A * 12/1934 Persons ..................... F24F 6/04 261/119.1
4,286,577 A * 9/1981 Spencer et al. ..... F28D 20/0034 126/630
6,380,081 B1 4/2002 Lee
6,921,062 B2 7/2005 Gregg et al.
7,300,038 B2 11/2007 Gregg et al.
7,487,956 B2 2/2009 Gregg et al.
7,828,274 B2 11/2010 Gregg et al.

* cited by examiner

*Primary Examiner* — Charles Bushey

(57) ABSTRACT

A system for supplying vaporized precursor includes an enclosure including an output. A plurality of trays is arranged in a stacked, spaced configuration inside the enclosure. The plurality of trays is configured to hold liquid precursor. A first conduit fluidly connects a carrier gas supply to the enclosure and includes a plurality of openings. A first valve is arranged along the first conduit and is configured to selectively control delivery of the carrier gas from the carrier gas supply through the first conduit to the plurality of openings in the first conduit. The plurality of openings is configured to direct the carrier gas across the liquid precursor in the plurality of trays, respectively. The output of the enclosure provides a mixture of the carrier gas and the vaporized precursor.

22 Claims, 10 Drawing Sheets

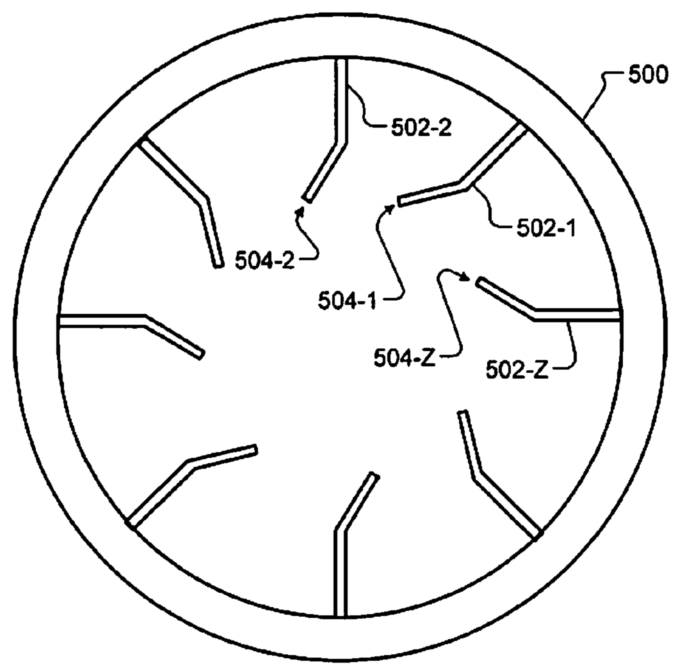
FIG. 4
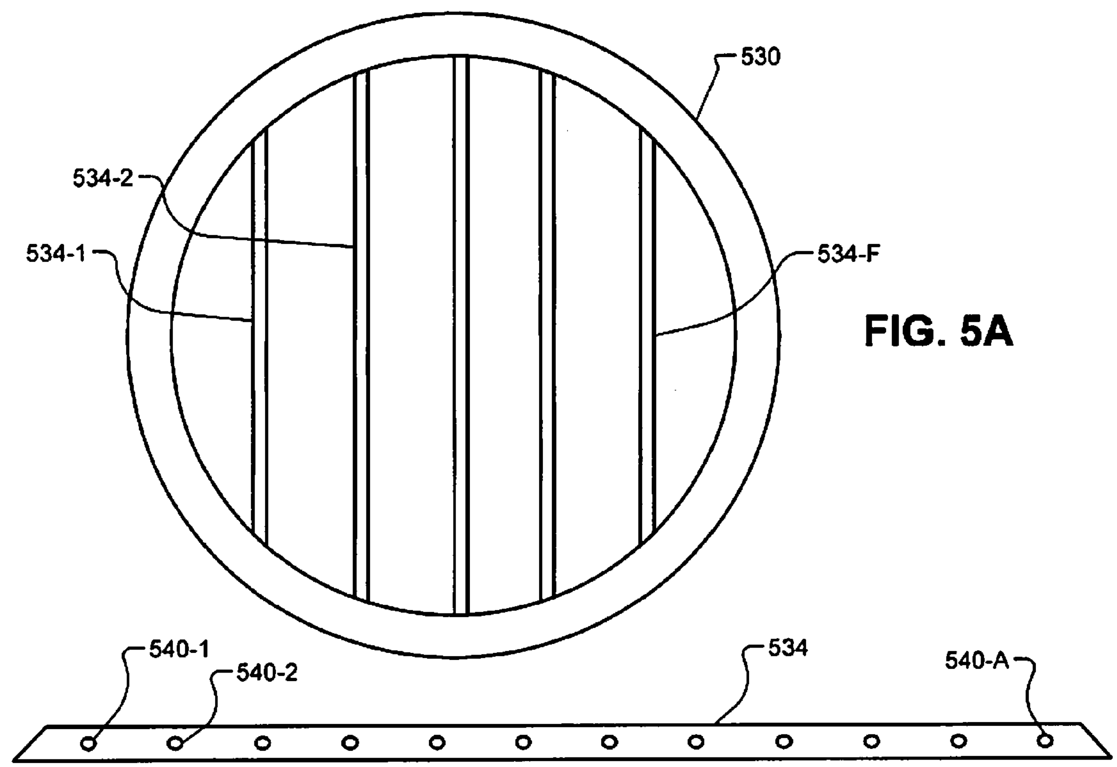
FIG. 5A
FIG. 5B

MULTI-TRAY BALLAST VAPOR DRAW SYSTEMS

FIELD

The present disclosure relates to systems and methods for supplying vaporized precursor to a substrate processing tool.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing tools are used to process substrates such as semiconductor wafers. The processing often involves exposing the substrate in a processing chamber to vaporized precursor. For example only, processes such as chemical vapor deposition (CVD), plasma-enhanced CVD (PECVD), atomic layer deposition (ALD), plasma-enhanced ALD (PEALD) and fluorine free tungsten (FFW) expose the substrate to one or more vaporized precursors when depositing a layer on the substrate.

One approach for generating the vaporized precursor involves vaporizing a liquid precursor. It is difficult to vaporize liquid precursors with low vapor pressure (generally less than 1 Torr at room temperature) and high viscosity (>5 cP). Liquid precursors with low vapor pressure and high viscosity easily re-condense and cannot be vaporized using direct liquid injection since high viscosity liquids do not atomize easily. Also, liquid precursors that decompose at temperatures well below the boiling point are not suitable for being vaporized post atomization. Systems and methods for vaporizing precursors with low to medium vapor pressure typically include vapor draw, bubblers or flow over a single surface of liquid inside an ampoule. Other options use atomizers and vaporizers. However, for low to moderate flow rates of precursors, vaporizers are not ideal.

Standard bubblers are able to saturate a carrier gas with precursor. However, the carrier gas flow rate is often limited by splashing concerns. Single surface flow-over systems where the carrier gas flows into an ampoule but not into the liquid are able to increase total pressure in the ampoule such that the vaporized precursor can flow from the ampoule to the processing chamber. However, the carrier gas does not saturate with the vapor and the amount of vaporized precursor that can be transported to the processing chamber is relatively low.

SUMMARY

A system for supplying vaporized precursor includes an enclosure including an output. A plurality of trays is arranged in a stacked, spaced configuration inside the enclosure. The plurality of trays is configured to hold liquid precursor. A first conduit fluidly connects a carrier gas supply to the enclosure and includes a plurality of openings. A first valve is arranged along the first conduit and is configured to selectively control delivery of the carrier gas from the carrier gas supply through the first conduit to the plurality of openings in the first conduit. The plurality of openings is configured to direct the carrier gas across the liquid precursor in the plurality of trays, respectively. The output of the enclosure provides a mixture of the carrier gas and the vaporized precursor.

A method for supplying vaporized precursor includes arranging a plurality of trays in a stacked, spaced configuration inside an enclosure; at least partially filling the plurality of trays with liquid precursor; using a first conduit to fluidly connect a carrier gas supply to the enclosure; controlling delivery of the carrier gas from the carrier gas supply through the first conduit to a plurality of openings in the first conduit; configuring the plurality of openings in the first conduit to direct the carrier gas across the liquid precursor in the plurality of trays, respectively; and providing a mixture of the carrier gas and the vaporized precursor at an output of the enclosure.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 4 illustrates an example of ring including nozzles that project inwardly to direct carrier gas on a tray according to the present disclosure;

FIG. 5A illustrates another example of ring including nozzles arranged on crossbars to direct carrier gas on a tray according to the present disclosure;

FIG. 5B is an enlarged bottom view of nozzles on one of the crossbars of FIG. 5A;

In the drawings, reference numbers may be reused to identify similar and/or identical elements.

DETAILED DESCRIPTION

The present disclosure relates to systems and methods for increasing precursor evaporation in a flow over, ballast or carrier gas type system by using increased surface interface areas between the carrier gas and a liquid precursor. In one example, the increased surface area is provided by multiple trays that store the liquid precursor. Multiple gas flow outlets increase carrier gas/precursor interaction. The systems and methods also provide improved heat transfer from a heater to a liquid/vapor interface. For example, the heater may be arranged in a central support member in the chamber.

The systems and methods include a system for refilling the multiple trays. For example only, levels of liquid precursor in the multiple trays may be managed by equalizing fill rates of liquids in each of the multiple trays using one or more level sensors. For example, the systems and methods can be used as a high surface area vapor draw system for increased vapor flow rates for medium vapor pressure precursors with or without using carrier gas.

Figure 1A:
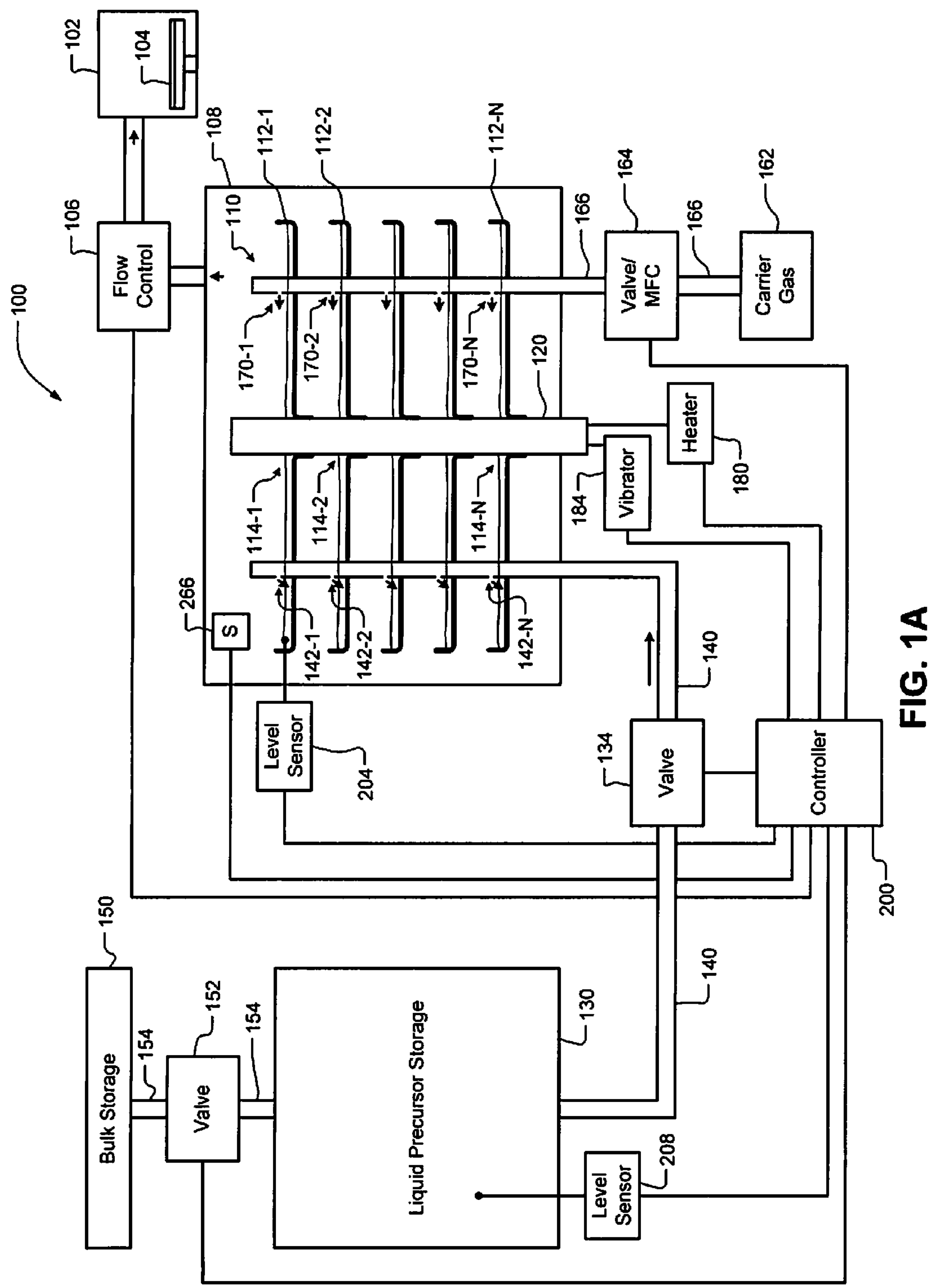
FIG. 1A illustrates an example of a multi-tray ballast vapor draw system according to the present disclosure.
Figure 1B:
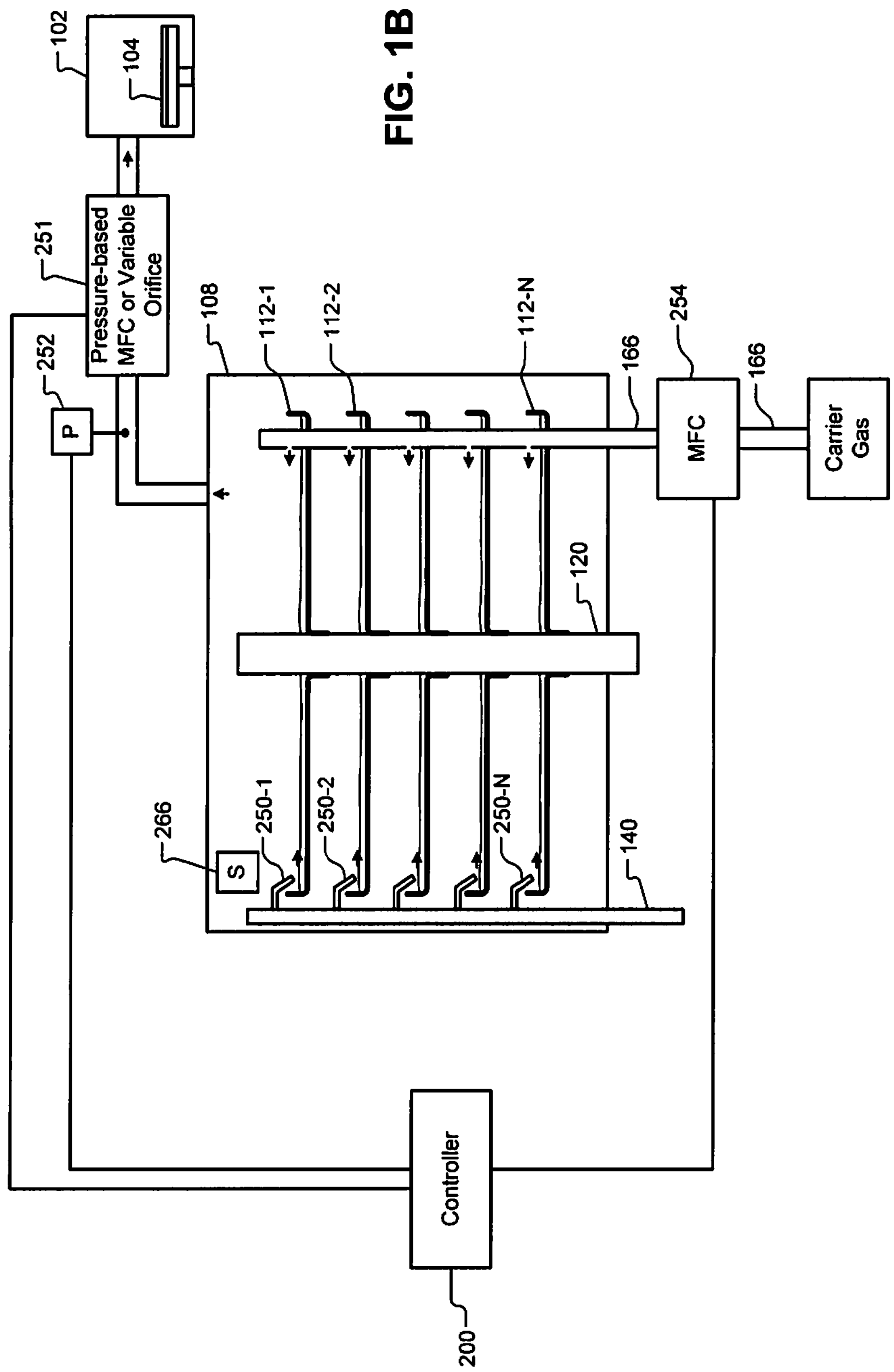
FIG. 1B illustrates an example of a portion of a multi-tray ballast vapor draw system according to the present disclosure.

Referring now to FIGS. 1A and 1B, a vaporized precursor delivery system 100 supplies vaporized precursor to a process chamber 102 for processing substrates 104 such as semiconductor wafers. In some examples, a flow control device 106 such as a valve, a restricted orifice or mass flow controller may be used to control the supply of vaporized precursor to the process chamber 104.

The vaporized precursor delivery system 100 includes an enclosure 108 and a tray assembly 110 arranged in the enclosure 108. The tray assembly 110 includes multiple trays 112-1, 112-2, . . . , and 112-N (collectively trays 112). Each of the trays 112 may include an opening 114-1, 114-2, . . . , and 114-N (collectively openings 114) to provide a mounting location for connection to a support member 120. Alternatively, the support member can be omitted and alternative support mechanisms can be used. For example, the trays may be supported by sides of the enclosure (e.g. using slots or projections) or spacers between edges of the trays can be used. Sides of the trays 112 are open to allow carrier gas to flow freely there between. For example, the trays 112 may have a circular, square, rectangular, uniform, non-uniform or other shaped cross-section. The trays 112 may be arranged in a stacked, uniformly-spaced arrangement to allow carrier gas to flow freely across the liquid precursor. Each of the trays 112 defines a volume for receiving and storing liquid precursor. In some examples, the support member 120 and the trays 112 may be made of a thermally conductive material such as stainless steel, aluminum, or other material that allows heat transfer.

A liquid precursor storage tank 130 supplies liquid precursor via a valve 134 and one or more conduits 140 to the trays 112. Gravity, a pump, or an inert push gas such as helium may be used to increase line pressure. The conduit 140 may pass through openings in each of the trays 112. Openings 142-1, 142-2, . . . , and 142-N in the conduit 140 are arranged to supply the liquid precursor to each of the trays 112-1, 112-2, . . . , and 112-N.

In other examples, the conduit 140 is arranged along a side of the trays 112 and includes extensions 250-1, 250-2, . . . , and 250-N (collectively extensions 250) that extend transversely from the conduit 140, as shown in FIG. 1B. The extensions 250 in FIG. 1B extend inwardly (or inwardly and downwardly) to deliver the liquid precursor to the trays 112.

The liquid precursor storage tank 130 may be filled periodically by a bulk storage tank 150 using a valve 152 and conduit 154. Carrier gas 162 may be supplied by one or more valves and/or mass flow controllers (MFC) identified at 164 and conduit 166. The conduit 166 includes one or more restricted openings or sets of restricted openings arranged to direct carrier gas across each of the trays 112. Each of the sets of openings may include multiple openings that provide carrier gas flow in multiple directions. Openings 170-1, 170-2, . . . , and 170-N in the conduit 166 deliver carrier gas flow over the trays 112.

In some examples, a heater 180 may be used to indirectly heat the support member 120, which transfers heat to the trays 112 and the liquid precursor in the trays 112. Alternatively, a heater may be arranged inside of the support member. In some examples, one or more vibrating devices 184 may be used to impart vibration to the support member 120 (as shown) or individually to the trays 112.

A controller 200 may be used to control one or more of the valves in the vaporized precursor delivery system 100. For example, the controller 200 may control the flow control device 106 to adjust the amount of vaporized precursor that is delivered to the process chamber 104. The controller 200 may be connected to one or more level sensors 204 to sense a level of liquid precursor in one or more of the trays 112. Based on the sensed level of the liquid precursor in one or more of the trays 112, the controller 200 may be used to control the valve 134 to supply additional liquid precursor. The controller 200 may be used to control the valve 164 to adjust the flow of carrier gas across the trays 112. The controller 200 may be connected to one or more level sensors 208 to sense a level of liquid precursor in the liquid precursor storage tank 130. Based on the sensed level of the liquid precursor storage tank 130, the controller 200 may be used to control the valve 134 to supply additional liquid precursor to refill the liquid precursor storage tank 130.

Figure 1C:
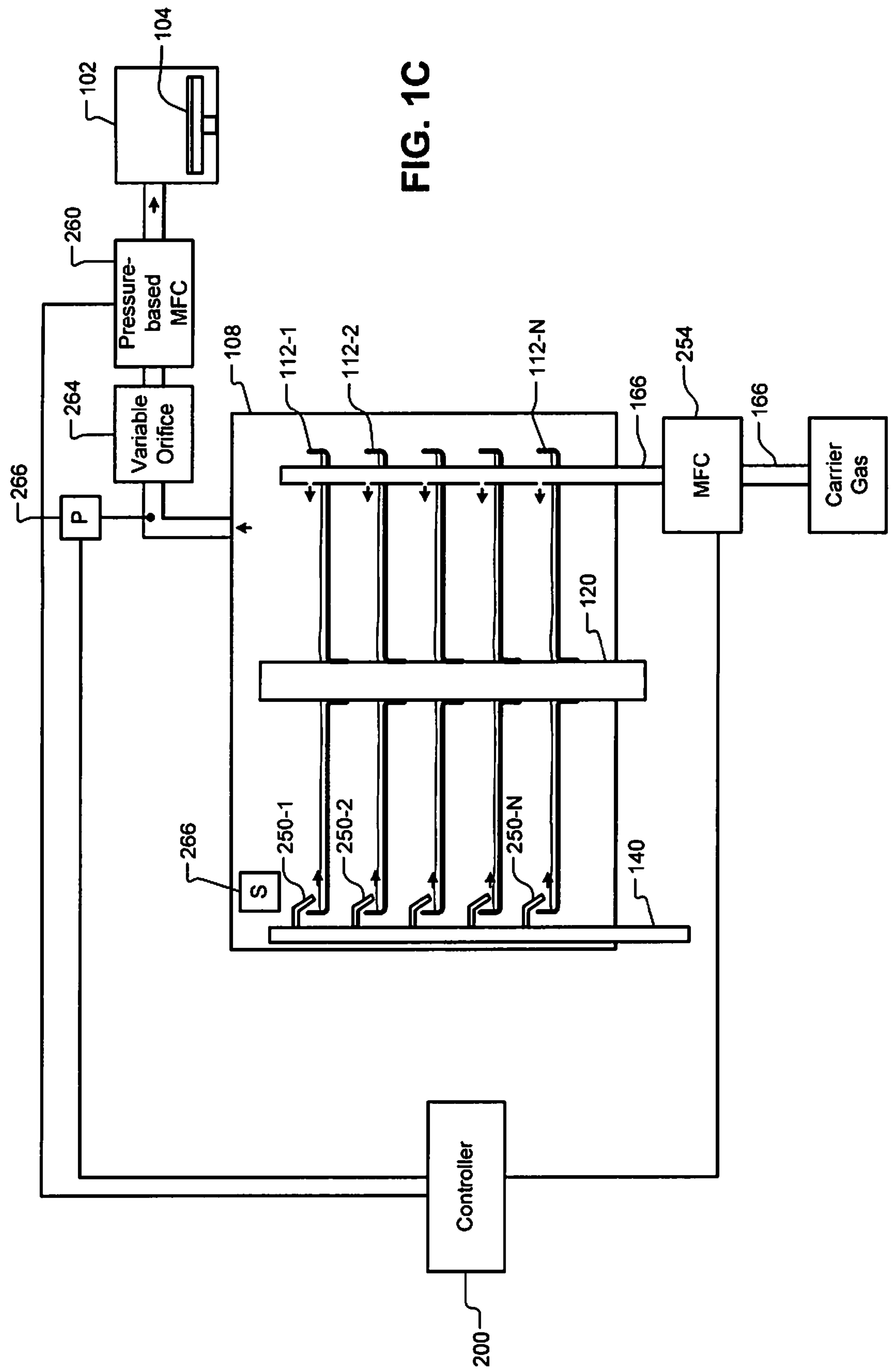
FIG. 1C illustrates another example of a portion of a multi-tray ballast vapor draw system according to the present disclosure.

Referring now to FIGS. 1B and 1C, various examples of control approaches are shown. In FIG. 1B, a pressure-based mass flow controller (MFC) or variable orifice identified at 251 may be set to a fixed value and used to provide a floating pressure. A pressure sensor 252 provides feedback to a controller 200, which controls a MFC 254. In FIG. 1C, a fixed pressure approach is shown and includes a pressure-based MFC 260 and a variable restricted orifice 264. A pressure sensor 266 provides pressure feedback to the controller 200, which controls the variable restricted orifice 264 and the MFC 254. Alternately, the pressure sensor may provide feedback to a back pressure controller that is placed downstream of the pressure sense location. The back pressure controller is in essence an orifice that is being controlled to a certain opening until the pressure required upstream of it is met. This control approach is used when a constant total pressure in the ampoule is desired.

Figure 2A:
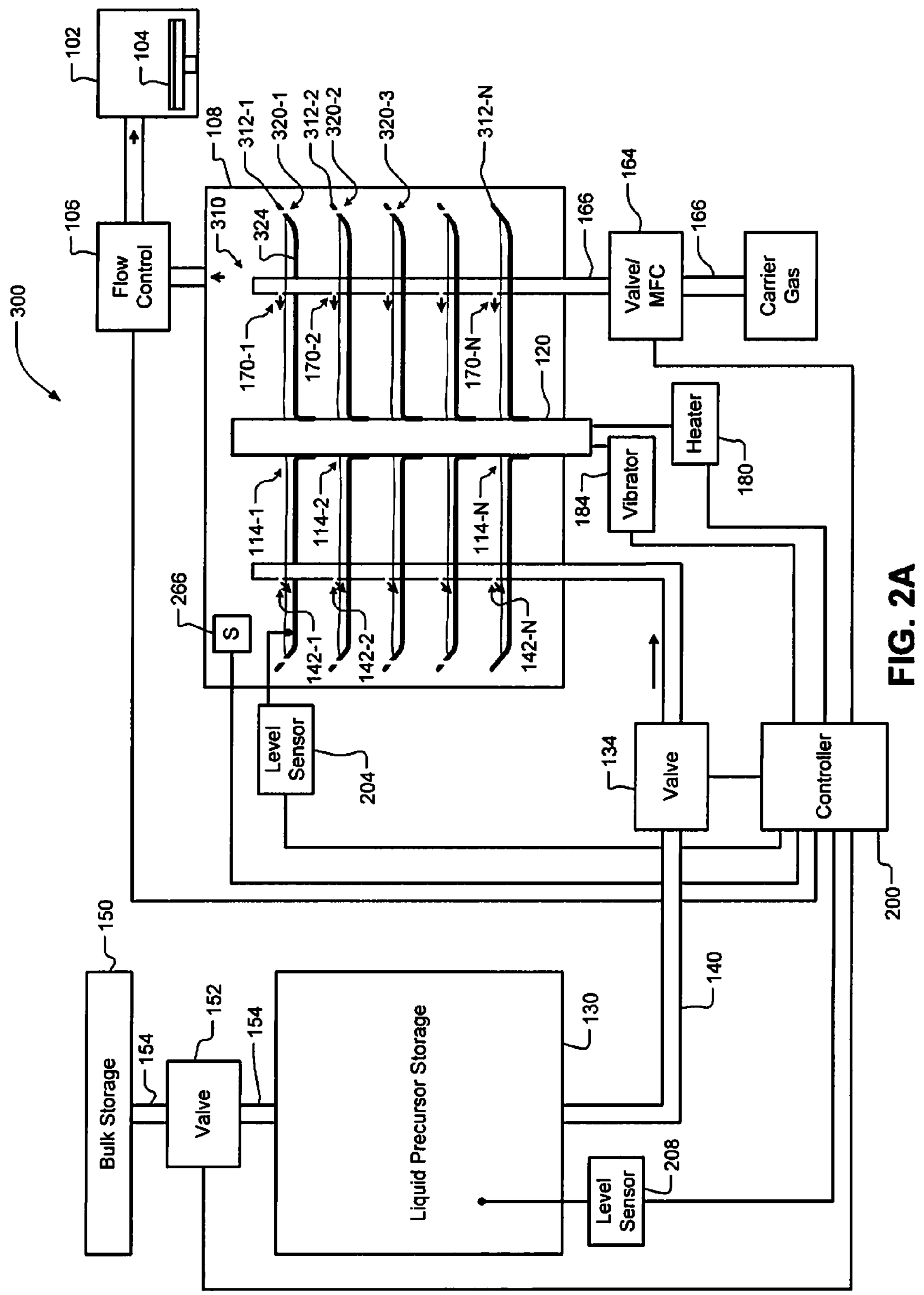
FIG. 2A illustrates another example of a multi-tray ballast vapor draw system according to the present disclosure.

Referring now to FIG. 2A, a multi-tray ballast system 300 includes an enclosure 108 and a multi-tray assembly 310 arranged in the enclosure 108. The multi-tray assembly 310 includes multiple trays 312-1, 312-2, . . . , and 312-N (collectively trays 312). The trays 312-1, 312-2, . . . , and 312-N include liquid openings 320-1, 320-2, . . . , and 320-N arranged at one or both ends thereof. The liquid openings 320-1, 320-2, . . . , and 320-N-1 (collectively liquid openings 320) (or N, if the bottommost tray 312 includes a liquid opening) are arranged at portions of the trays 312 that are above an upwardly facing surface 324 of the trays 312 to allow a predetermined volume or surface area of the liquid precursor to collect in a corresponding tray 312 before flowing through the liquid openings 320.

Figure 2B:
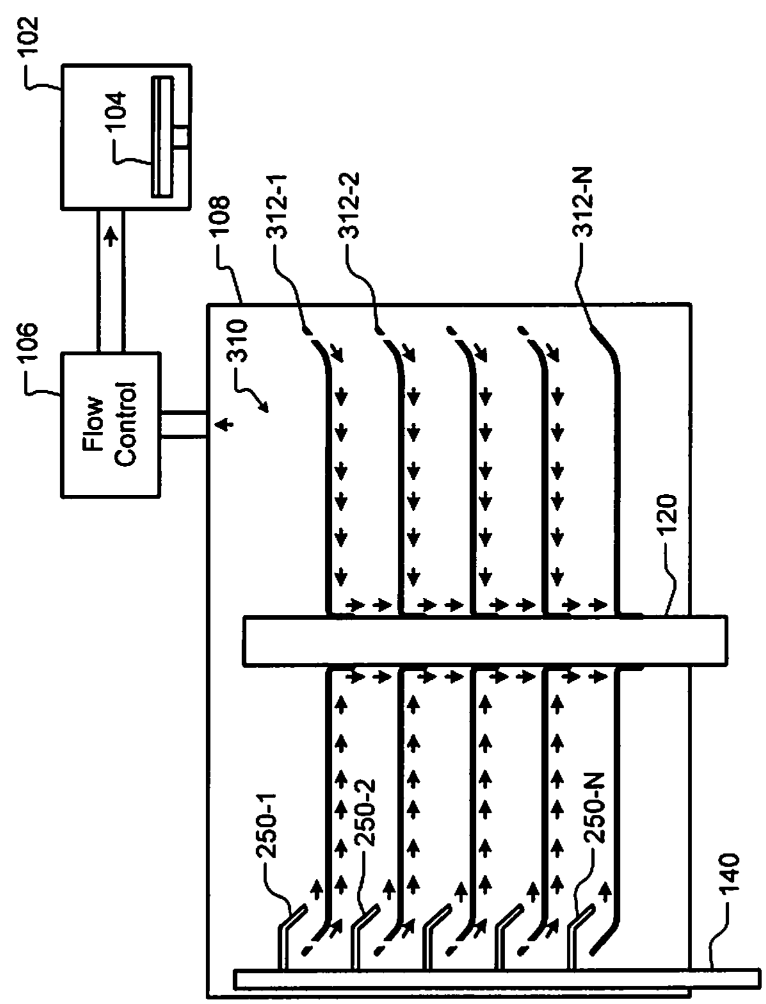
FIGS. 2B and 2C illustrate examples of alternate liquid delivery systems for a multi-tray ballast vapor draw system according to the present disclosure.
Figure 2C:
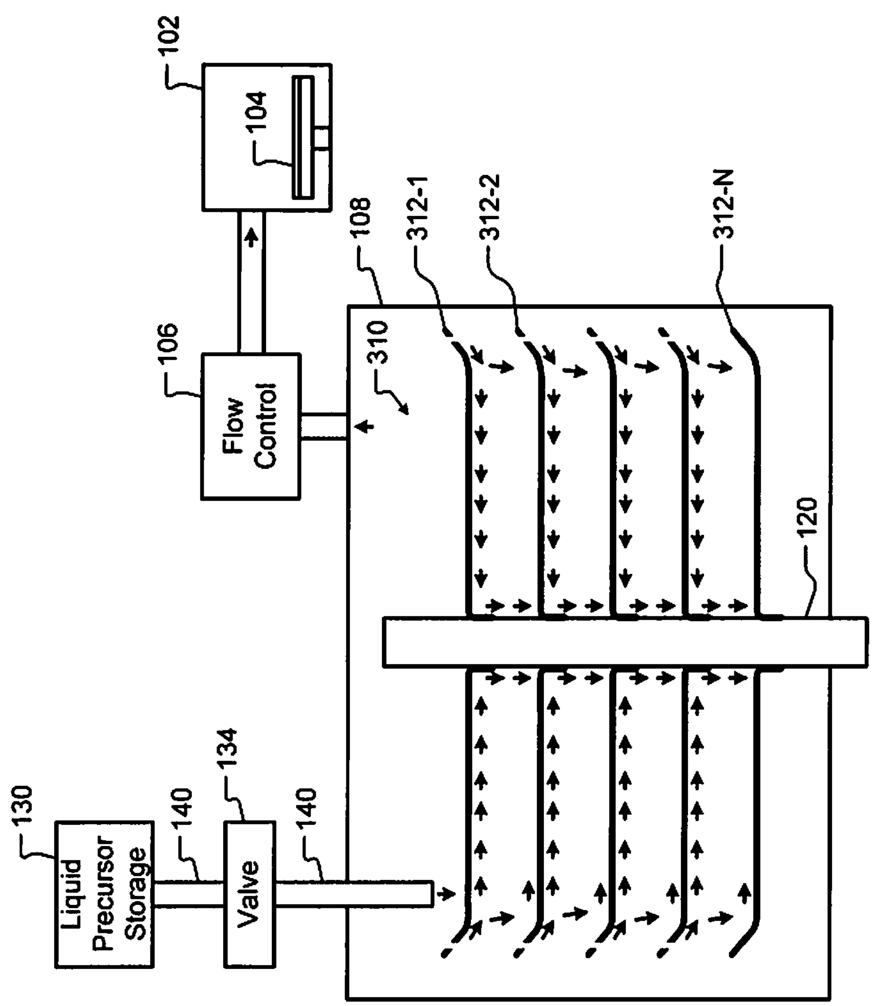

Referring now to FIGS. 2B and 2C, the liquid precursor may be delivered in several other ways. For example, in FIG. 2B, the liquid precursor is delivered from the side. When a sufficient volume of liquid precursor is present, the liquid precursor flows through one or more liquid openings 320 in the tray 312-1. Some of the liquid precursor will drain directly to a next lower tray, e.g. the tray 312-2, and some will flow along a bottom surface of the tray 312-1 due to liquid surface tension and attractive forces. As can be appreciated, addition exposed surface area of liquid precursor is provided by the liquid precursor flowing along the bottom surfaces of the trays 312 (as compared to the systems in FIGS. 1B and 1C). In FIG. 2C, the liquid precursor is delivered to the top tray 312-1 and the openings 320 are used to feed the liquid precursor to lower trays 312.

Figure 3:
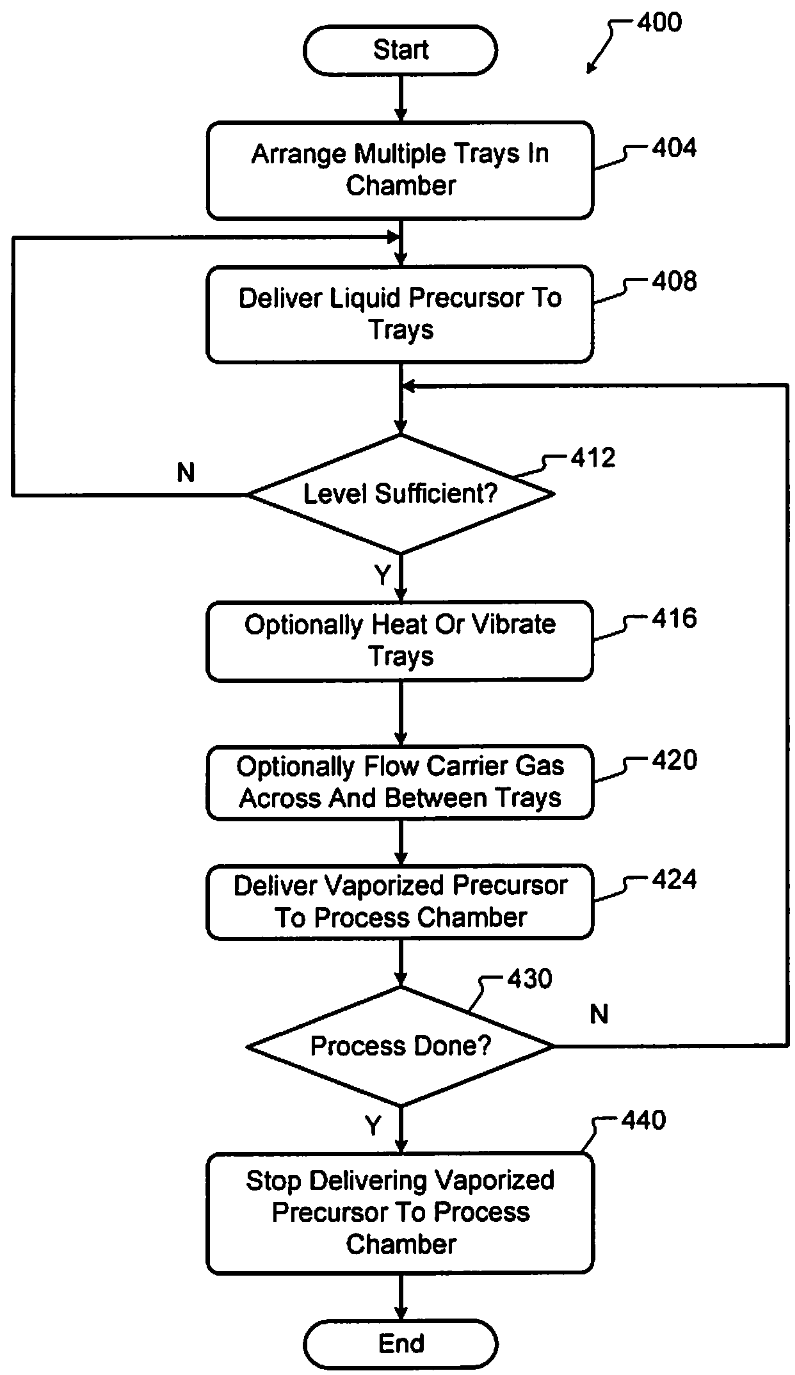
FIG. 3 illustrates a method for delivering vaporized precursor to a substrate processing system according to the present disclosure.

Referring now to FIG. 3, a method 400 is shown. At 404, multiple trays are arranged in the chamber. At 408, liquid precursor is delivered to the trays. At 412, the method determines whether the level of the liquid precursor is sufficient in the trays. If not, the method returns to 408. If 412 is true, the trays are optionally heated or vibrated at 416. At 420, flow of carrier gas is optionally supplied across and between the trays. At 424, vaporized precursor is delivered to the process chamber. At 430, the method determines whether the process is done. If not, the method returns to 412. Otherwise, the method continues at 440 and stops delivering vaporized precursor to the process chamber.

Referring now to FIG. 4, a ring 500 may be arranged above each of the trays. The ring 500 includes projections 502-1, 502-2, . . . and 502-Z (collectively projections 502), where Z is an integer greater than one. The projections 502 are shown to project generally radially inwardly. Ends of the projections 502 include openings or nozzles 504-1, 504-2, . . . 504-Z (collectively openings or nozzles 504) to direct carrier gas on a surface of a tray. The nozzles 504 may be designed for choked flow and high velocity at the outlet. The projections 502 may have any suitable configuration. The projections 502 may be straight, curved, bent (as shown in FIG. 4) or any other suitable configuration. The projections 502 may have a bent configuration to increase turbulence. The projections 502 may be bent in a circumferential direction to create a spiral flow pattern as shown and/or downwardly towards the surface of the tray.

Referring now to FIGS. 5A and 5B, another ring 530 is shown. In FIG. 5A, the ring 530 includes crossbars 534-1, 534-2, . . . and 534-F (collectively crossbars 534) where F is an integer that are spaced from one another and that extend from one side of the ring 530 to the opposite side of the ring 530. The crossbars 534 may be arranged in parallel as shown or other patterns. In FIG. 5B, openings 540-1, 540-2, . . . and 540-A (collectively openings 540) where A is an integer are shown arranged on one side of one of the crossbars 534 to direct flow at the surface of the tray. Nozzles can be arranged in the openings 540. The nozzles may be designed for choked flow and high velocity at the outlet.

As can be appreciated, in some examples the openings 540 may be arranged on opposite surfaces of the crossbars 534 to direct carrier gas in opposite directions. This arrangement may be useful to increase turbulence. This arrangement is also particularly useful when liquid precursor flows along a bottom surface of the trays.

Figure 6:
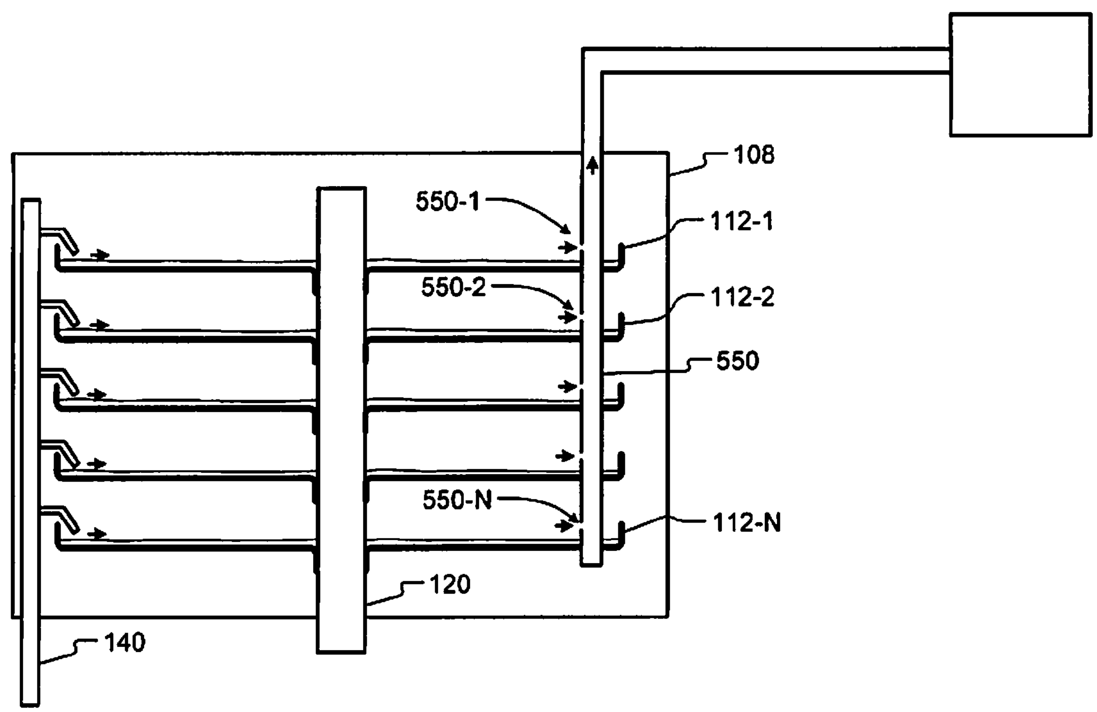
FIG. 6 illustrates a conduit with openings for directing vaporized precursor and carrier gas to a process chamber.

Referring now to FIG. 6, a conduit 550 with openings 550-1, 550-2, . . . , and 550-N may be used to direct vaporized precursor and carrier gas to a process chamber.

Figure 7A:
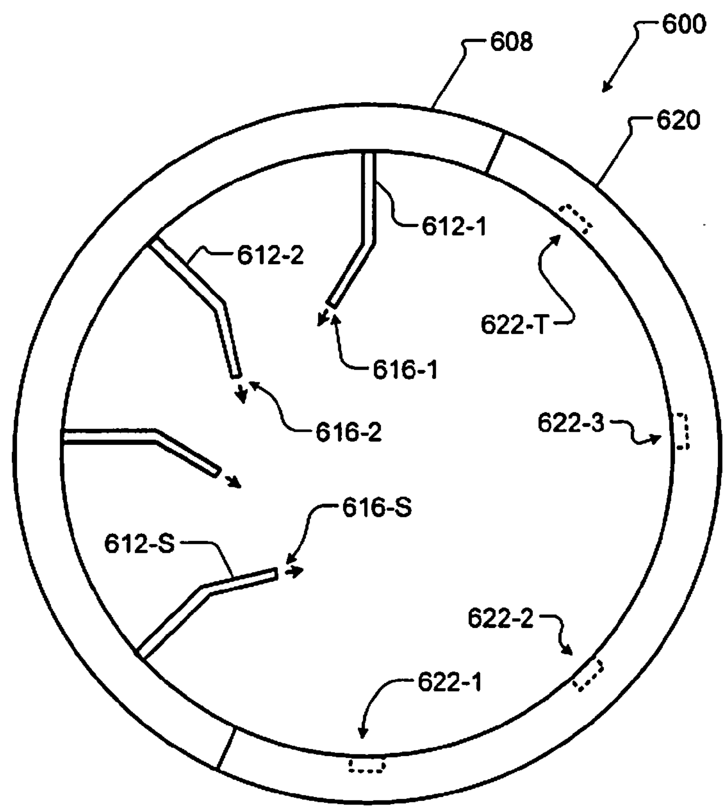
FIGS. 7A and 7B illustrate examples of split rings according to the present disclosure.
Figure 7B:
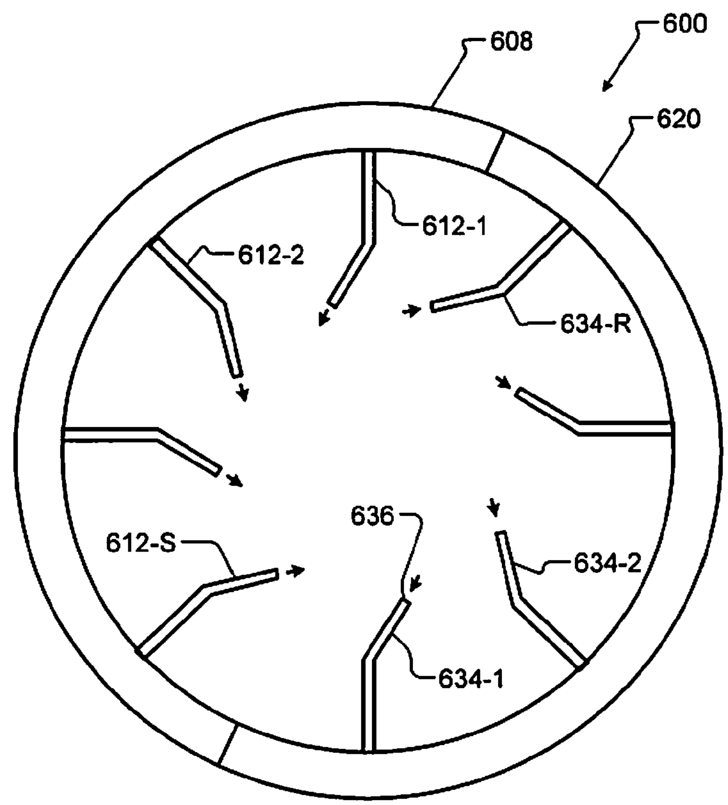

Referring now to FIGS. 7A and 7B, a split ring 600 may be used. The split ring 600 may include a first ring portion 608 and a second ring portion 620. The first ring portion 608 is connected to a source of carrier gas and includes projections 612-1, 612-2, . . . , and 612-S (collectively projections 612) with openings or nozzles 616-1, 616-2, . . . , and 616-S (collectively openings or nozzles 616) to direct carrier gas on liquid held in a tray. In other examples, nozzles 616 may be arranged directly on the first ring portion 608 instead of using the projections 612.

In FIG. 7A, the second ring portion 620 includes openings 622-1, 622-2, . . . and 622-T (where T is an integer greater than one) (collectively openings 622) on a radially inner surface of the second ring portion 620 for recovering vaporized precursor and carrier gas. The openings 622 may be spaced evenly apart and may connect to a manifold. The size and number of the openings 622 on the second ring portion 620 are selected to provide high conductance path so that the vapor can flow a without pressure drop.

In FIG. 7B, the second ring portion 620 includes projections 634-1, 634-2, . . . and 634-R (collectively projections 634) extending from the ring (where R is an integer greater than one) for recovering vaporized precursor and carrier gas. Openings 636 at the end of the projections 634 on the second ring portion 620 may be high conductance openings so that the vapor can flow a without pressure drop.

The conduits that direct gas flow at the liquid surface can include openings in a tube or projections that increase turbulence at a surface of the liquid in the tray. Turbulent flows enhance heat and mass transfer coefficients and enhance the evaporation rate from each tray. Given the ability to refill the trays to keep the level in the trays constant, this type of directed projection becomes feasible (dropping liquid levels would otherwise cause changing projection to surface dynamic). Similarly, vibration devices can be used to enhance turbulence.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term controller may be replaced with the term circuit. The term controller may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple controllers. The term group processor encompasses a processor that, in combination with additional processors, executes some or all code from one or more controllers. The term shared memory encompasses a single memory that stores some or all code from multiple controllers. The term group memory encompasses a memory that, in combination with additional memories, stores some or all code from one or more controllers. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:

1. A system for supplying vaporized precursor, comprising:

an enclosure including an output;

a plurality of trays arranged in a stacked, spaced configuration inside the enclosure, wherein the plurality of trays are configured to hold liquid precursor;

a first conduit fluidly connecting a carrier gas supply to the enclosure and including a plurality of openings, wherein each of the plurality of openings is arranged to supply a portion of the carrier gas at or across the liquid precursor in a respective one of the plurality of trays; and a first valve arranged along the first conduit and configured to selectively control delivery of the carrier gas from the carrier gas supply through the first conduit to the plurality of openings in the first conduit, wherein the output of the enclosure provides a mixture of the carrier gas and the vaporized precursor.

2. The system of claim 1, further comprising:

a second conduit including at least one opening and fluidly connecting a source of liquid precursor and at least one of the plurality of trays; and a second valve arranged along the second conduit and configured to selectively control delivery of the liquid precursor from the source of liquid precursor through the opening in the second conduit to the at least one of the plurality of trays.

3. The system of claim 2, further comprising:

a level sensor to sense a level of the liquid precursor in at least one of the plurality of trays; and a controller to selectively control the second valve based on the level.

4. The system of claim 1, further comprising a liquid precursor storage tank configured to supply the liquid precursor.

5. The system of claim 1, further comprising a support member arranged in the enclosure, wherein the plurality of trays are connected to the support member.

6. The system of claim 5, wherein the support member and the plurality of trays are made of a thermally conductive material.

7. The system of claim 5, wherein the plurality of trays defines an opening and wherein the support member passes through the opening of the plurality of trays.

8. The system of claim 5, wherein:

the plurality of trays comprise N trays each defining an opening, where N is an integer greater than one;

the support member passes through the opening of the N trays;

at least N−1 of the N trays include at least one opening located at end portions of the at least N−1 of the N trays; and the liquid precursor passes through the at least one opening of the N−1 trays to an adjacent lower one of the N trays when a level of the liquid precursor in the one of the at least N−1 trays is greater than a predetermined level.

9. The system of claim 1, further comprising a level sensor to sense a level of the liquid precursor in at least one of the plurality of trays.

10. The system of claim 1, wherein each of the plurality of trays are spaced a predetermined distance from at least one adjacent one of the plurality of trays.

11. The system of claim 1, further comprising:

a plurality of rings each arranged above a corresponding one of the plurality of trays; and wherein each of the plurality of rings includes a plurality of crossbars that include nozzles arranged on at least one side thereof.

12. The system of claim 1, further comprising:

a plurality of split rings each arranged above a corresponding one of the plurality of trays; and wherein each of the plurality of split rings includes a first ring portion including projections and nozzles for directing the carrier gas onto the liquid precursor in the plurality of trays and a second ring portion including openings for collecting the vaporized precursor.

13. The system of claim 1, further comprising:

a second conduit including a plurality of openings arranged adjacent to the plurality of trays, respectively, to collect the vaporized precursor, wherein the output of the enclosure is connected to the second conduit.

14. The system of claim 1, wherein the plurality of trays are disposed in an open area in the enclosure, such that the carrier gas is free to flow around the plurality of trays.

15. The system of claim 1, wherein:

the plurality of trays comprise a first tray and a second tray;

the first tray is disposed above the second tray; and the first tray comprises a hole through which a portion of the liquid precursor drains to the second tray.

16. The system of claim 1, further comprising a second conduit, wherein:

the second conduit comprises extensions; and each of the extensions extends inwardly and directs a portion of the liquid precursor in a respective one of the plurality of trays.

17. The system of claim 1, further comprising:

a plasma chamber; and a flow control device controlling flow of the mixture of the carrier gas and the vaporized precursor from the output of the enclosure to the plasma chamber.

18. A system for supplying vaporized precursor, comprising:

an enclosure including an output;

a plurality of trays arranged in a stacked, spaced configuration inside the enclosure, wherein the plurality of trays are configured to hold liquid precursor;

a first conduit fluidly connecting a carrier gas supply to the enclosure and including a plurality of openings;

a first valve arranged along the first conduit and configured to selectively control delivery of the carrier gas from the carrier gas supply through the first conduit to the plurality of openings in the first conduit, wherein the plurality of openings are configured to direct the carrier gas across the liquid precursor in the plurality of trays, respectively, and wherein the output of the enclosure provides a mixture of the carrier gas and the vaporized precursor;

a support member arranged in the enclosure, wherein the plurality of trays are connected to the support member; and a heater at least one of connected to the support member or arranged inside the support member, wherein the heater is dedicated to heating the support member, and wherein thermal energy transfers from the support member to the plurality of trays and the liquid precursor.

19. The system of claim 18, wherein the heater is an electric heater.

20. The system of claim 18, wherein each of the plurality of openings is arranged to supply a portion of the carrier gas at or across the liquid precursor in a respective one of the plurality of trays.

21. A system for supplying vaporized precursor, comprising:

an enclosure including an output;

a plurality of trays arranged in a stacked, spaced configuration inside the enclosure, wherein the plurality of trays are configured to hold liquid precursor;

a first conduit fluidly connecting a carrier gas supply to the enclosure and including a plurality of openings;

a first valve arranged along the first conduit and configured to selectively control delivery of the carrier gas from the carrier gas supply through the first conduit to the plurality of openings in the first conduit, wherein the plurality of openings are configured to direct the carrier gas across the liquid precursor in the plurality of trays, respectively, and wherein the output of the enclosure provides a mixture of the carrier gas and the vaporized precursor;

a support member arranged in the enclosure, wherein the plurality of trays are connected to the support member; and a vibrating device configured to vibrate at least one of the support member and the plurality of trays.

22. A system for supplying vaporized precursor, comprising:

an enclosure including an output;

a plurality of trays arranged in a stacked, spaced configuration inside the enclosure, wherein the plurality of trays are configured to hold liquid precursor;

a first conduit fluidly connecting a carrier gas supply to the enclosure and including a plurality of openings;

a first valve arranged along the first conduit and configured to selectively control delivery of the carrier gas from the carrier gas supply through the first conduit to the plurality of openings in the first conduit, wherein the plurality of openings are configured to direct the carrier gas across the liquid precursor in the plurality of trays, respectively, and wherein the output of the enclosure provides a mixture of the carrier gas and the vaporized precursor; and a plurality of rings each arranged above a corresponding one of the plurality of trays, wherein each of the plurality of rings includes (i) projections and one or more nozzles, or (ii) a plurality of crossbars that include nozzles arranged on at least one side thereof.

* * * * *